(12) United States Patent
Duqi et al.

(10) Patent No.: US 11,873,215 B2
(45) Date of Patent: Jan. 16, 2024

(54) MEMS DEVICE HAVING A RUGGED PACKAGE AND FABRICATION PROCESS THEREOF

(71) Applicant: STMICROELECTRONICS S.R.L., Agrate Brianza (IT)

(72) Inventors: Enri Duqi, Milan (IT); Marco Del Sarto, Monza (IT); Lorenzo Baldo, Bareggio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/684,317

(22) Filed: Mar. 1, 2022

(65) Prior Publication Data

US 2022/0185661 A1    Jun. 16, 2022

Related U.S. Application Data

(62) Division of application No. 16/596,317, filed on Oct. 8, 2019, now abandoned.

(30) Foreign Application Priority Data

Oct. 12, 2018    (IT) .................. 102018000009408

(51) Int. Cl.
  *B81C 1/00*    (2006.01)
  *B81B 3/00*    (2006.01)
  *B81C 99/00*    (2010.01)

(52) U.S. Cl.
  CPC ........ *B81C 1/00325* (2013.01); *B81B 3/0018* (2013.01); *B81C 99/0005* (2013.01); *B81C 2201/112* (2013.01)

(58) Field of Classification Search
None
See application file for complete search history.

(56) References Cited

U.S. PATENT DOCUMENTS 7,145,253 B1 * 12/2006 Kim .................. B81C 1/00333
                                                  257/E23.126
9,073,748 B2    7/2015 Chou et al.
(Continued)

FOREIGN PATENT DOCUMENTS

CN    102717469 A  * 10/2012 ............. B29C 33/68
CN    110660675 A  *  1/2020 ......... H01L 21/4846
(Continued)

OTHER PUBLICATIONS

Cacchione et al., "Drop Test Modelling of Packaged MEMS by a Simplified Multi-Scale Approach," 9th US National Congress of Computational Mechanics, San Francisco, Jul. 23-26, 2007, 2 pages.

(Continued)

*Primary Examiner* — Telly D Green
(74) *Attorney, Agent, or Firm* — Seed IP Law Group LLP

(57) ABSTRACT

A MEMS device formed by a substrate, having a surface; a MEMS structure arranged on the surface; a first coating region having a first Young's modulus, surrounding the MEMS structure at the top and at the sides and in contact with the surface of the substrate; and a second coating region having a second Young's modulus, surrounding the first coating region at the top and at the sides and in contact with the surface of the substrate. The first Young's modulus is higher than the second Young's modulus.

20 Claims, 3 Drawing Sheets

(56) References Cited

U.S. PATENT DOCUMENTS

| | | | |
|---|---|---|---|
| 9,264,815 B2 | 2/2016 | Wang et al. | |
| 9,550,670 B2 | 1/2017 | Geissler et al. | |
| 9,771,260 B2 | 9/2017 | Chou et al. | |
| 9,842,811 B1 | 12/2017 | Chou | |
| 10,329,141 B2 | 6/2019 | Tocchio et al. | |
| 2008/0064131 A1* | 3/2008 | Chang | G02F 1/133603 |
| | | | 257/E33.059 |
| 2009/0238394 A1 | 9/2009 | Minamio et al. | |
| 2010/0276718 A1* | 11/2010 | Chang | G02F 1/133603 |
| | | | 257/98 |
| 2011/0175179 A1 | 7/2011 | Chiu et al. | |
| 2012/0086003 A1* | 4/2012 | Park | H01L 23/3121 |
| | | | 257/737 |
| 2012/0161362 A1* | 6/2012 | Ludwig | H01L 23/3135 |
| | | | 425/129.1 |
| 2013/0119493 A1 | 5/2013 | Chou et al. | |
| 2013/0299923 A1 | 11/2013 | Classen et al. | |
| 2013/0341736 A1 | 12/2013 | Kohl et al. | |
| 2014/0353775 A1* | 12/2014 | Formosa | H01L 24/97 |
| | | | 438/51 |
| 2015/0189443 A1 | 7/2015 | Wang et al. | |
| 2015/0189446 A1 | 7/2015 | Wang et al. | |
| 2015/0298969 A1 | 10/2015 | Chou et al. | |
| 2016/0068387 A1* | 3/2016 | Nakanishi | B81C 1/0023 |
| | | | 438/51 |
| 2016/0111581 A1* | 4/2016 | Prajuckamol | H01L 31/02005 |
| | | | 257/676 |
| 2017/0057810 A1 | 3/2017 | Murali et al. | |
| 2017/0088416 A1 | 3/2017 | Tocchio et al. | |
| 2017/0162742 A1* | 6/2017 | Prajuckamol | H01L 24/83 |
| 2017/0207193 A1 | 7/2017 | Bower et al. | |
| 2017/0358543 A1 | 12/2017 | Chou | |
| 2018/0096909 A1* | 4/2018 | Peerapaisansap | H01L 24/06 |
| 2020/0002159 A1 | 1/2020 | Theuss et al. | |

FOREIGN PATENT DOCUMENTS

| | | | |
|---|---|---|---|
| EP | 1814739 B1 | 6/2013 | |
| FR | 2872501 A1 | 1/2006 | |
| JP | 2009-226571 A | 10/2009 | |
| JP | 2011020291 A * | 2/2011 | |
| WO | WO-2012056395 A2 * | 5/2012 | B29C 45/16 |

OTHER PUBLICATIONS

Ghisi et al., "Multi-Scale Modeling of Shock-Induced Failure of Polysilicon MEMS," Proceeding Eurosime07, London, Apr. 2007, 6 pages.

* cited by examiner

MEMS DEVICE HAVING A RUGGED PACKAGE AND FABRICATION PROCESS THEREOF

BACKGROUND

Technical Field

The present disclosure relates to a MEMS (Micro Electro-Mechanical System) device and the fabrication process thereof.

Description of the Related Art

As is known, electronic apparatuses comprising MEMS devices, such as MEMS movement sensors, are increasingly widespread. For the correct operation of such apparatuses, it is desired that MEMS devices are capable of detecting movement variations in an accurate and precise way in all operating conditions. Consequently, it is desirable for MEMS devices to be sufficiently sturdy so as not to break even when they are subjected to abrupt movements (for example, as a result of the apparatus being dropped or undergoing mechanical shock). Furthermore, it is desirable that their performance not to be significantly affected by the above abrupt movements.

In most cases, it is not desirable to increase the robustness of MEMS devices by increasing their dimensions. In fact, MEMS movement sensors may be modelled as mass-spring systems, the resonance frequency thereof strictly depends on the geometry of the mass-spring system. Since the resonance frequency is an important parameter for determining the performance of the MEMS device, it is not desirable to improve the robustness of the MEMS device by modifying its dimensions since this would have an undesired impact on performance.

Consequently, known solutions for increasing robustness consist in providing mechanical stoppers operating outside of and/or within the extension plane of the MEMS movement sensor.

For instance, the U.S. Pat. Pub. No. 2013/299923 describes a micromechanical accelerometer comprising a seismic mass and a semiconductor substrate (for example, silicon) having a reference electrode. In particular, the seismic mass is moveable perpendicular to the reference electrode; moreover, the seismic mass comprises a flexible stopper operating in the movement direction of the seismic mass.

In addition, to increase robustness, it is known to treat the substrate by carrying out a slow etching step so as to maximize the contact area in the event of abrupt movements.

Furthermore, it is known to package MEMS movement sensors in resins capable of absorbing part of the acceleration due to the sharp movements so as to increase further robustness of the MEMS device.

However, known solutions have some disadvantages.

In fact, if subjected to repeated mechanical shocks with high accelerations, mechanical stoppers of a MEMS movement sensor undergo gradual damage and failure, causing failure of the mechanical stoppers in the long run, which thus no longer protect the MEMS movement sensor.

This is demonstrated by tumble tests carried out on single MEMS devices. For this purpose, the tested MEMS devices are dropped on a granite slab with different accelerations $\bar{a}$, $\bar{a}$ which depend on different variables, such as the contact stiffness, the roughness of the contact surface, the contact angle, the contact points or areas and the air resistance. In detail, the acceleration a acting on the package of the MEMS device upon impact with the granite slab is analytically estimated by the known Hertz theory (Eq. (1)):

$$a = \sqrt[5]{\frac{v_{imp}^6 R}{\left[m\left(\frac{1-v_t^2}{E_t} + \frac{1-v_d^2}{E_d}\right)\right]^2}} \quad (1)$$

where $v_{imp}$ is the speed of impact; R is the radius of the object, m is the mass of the MEMS sensor; $v_t$ and $v_d$ are the Poisson's ratios of the granite slab and of the MEMS device, respectively, and Et and Ed are the Young's modulus of the granite slab and of the MEMS device, respectively.

The Applicant has verified that, both by applying Eq. (1) and with the aid of Finite-Element Modelling (FEM) simulations, that a MEMS device having a package of 2×2 mm² perceives an acceleration a of approximately 100,000 g in case of the apparatus dropping in standard conditions, from approximately one meter of height from the granite slab. These repeated accelerations may lead to malfunctioning or failure of the MEMS device, thus rendering it unusable.

This problem is particularly felt when handling the MEMS device before assembling the package (in particular, fixing the MEMS device to a supporting structure). In detail, when the MEMS device is picked up by an automatic picker machine arranged on a supporting surface on which it is fixed (pick-and-place operation), impacts that lead to marked accelerations of the order, for example, of tens of thousands of g may occur.

BRIEF SUMMARY

Embodiments are directed to a MEMS device and a fabrication process thereof. In particular, the present disclosure relates to a MEMS (Micro Electro-Mechanical System) device having a rugged package and to the fabrication process thereof. More particularly, reference is made hereinafter to a packaging process that uses an injection molding system. Moreover, hereinafter reference is made to MEMS devices comprising one or more MEMS sensors capable of detecting movements (such as accelerometers), without this implying any loss of generality.

In one embodiment, a MEMS device is provided, formed by a substrate having a surface; a MEMS structure arranged on the substrate surface; a first coating region, having a first Young's modulus, surrounding the MEMS structure and in contact with part of the surface of the substrate; and a second coating region having a second Young's modulus, surrounding the first coating region and in contact with part of the surface of the substrate. The first Young's modulus is higher than the second Young's modulus.

The MEMS structure may be electrically coupled to the substrate.

BRIEF DESCRIPTION OF THE SEVERAL VIEWS OF THE DRAWINGS

For a better understanding of the present disclosure, an embodiment thereof is now described, purely by way of non-limiting example, with reference to the attached drawings, wherein.

DETAILED DESCRIPTION

Figure 1:
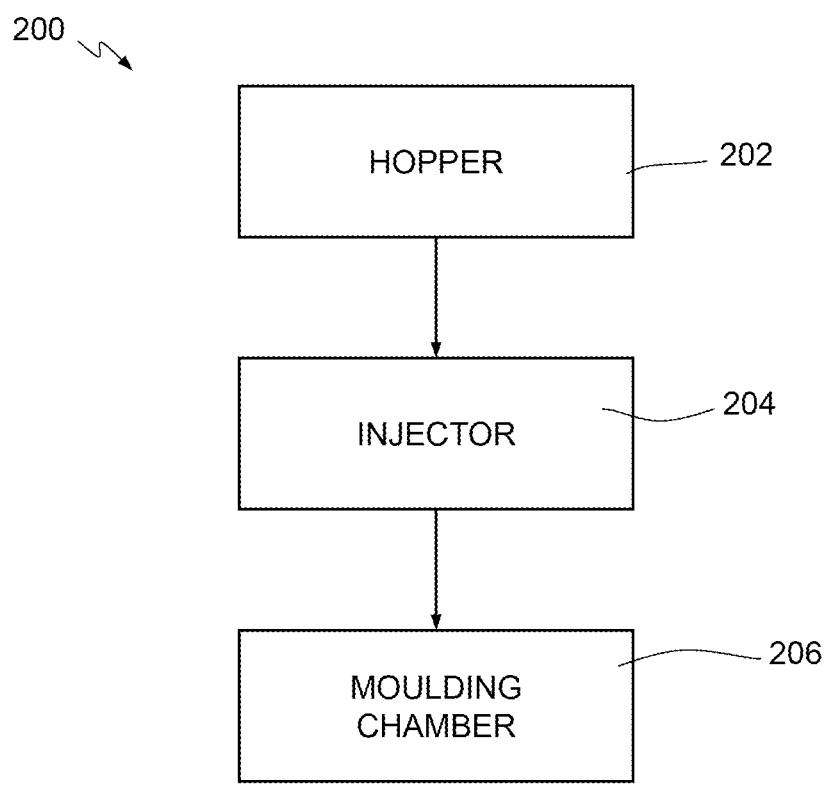
FIG. 1 shows a block diagram of an injection molding system.

FIG. 1 schematically illustrates an injection molding system, hereinafter referred to as system 200.

In particular, the system 200 comprises a hopper 202, which supplies a material to be injected in solid form (for example, in the form of pellets); an injector 204, provided with a heater and an injection system (not illustrated); and a molding chamber 206, housing one or more wafers or devices to be processed and comprising one or more molding matrices (not illustrated).

In use, in the molding chamber 206, the aforementioned one or more molding matrices are fixed to the wafer or to the device to be processed. In particular, the molding matrix or matrices have one or more cavities, which define the desired shape for the element to be molded on the wafer or on the device to be processed.

The hopper 202 supplies the material to be injected to the injector 204, which, through the heater, heats it up to the melting point (or, in case of plastic materials, the point of vitreous transition). The injection system of the injector 204 injects the molten material into the molding chamber 206, in particular into the one or more cavities of the molding matrix or matrices; in this way, the one or more cavities of the molding matrix or matrices is/are filled with the material that will constitute the element to be moulded.

Once injection is completed, still within the molding chamber, the injected material is subjected to a curing step and starts to polymerize and solidify so that the desired moulded element is obtained. When the moulded element has solidified, the molding matrix is removed.

Figure 3:
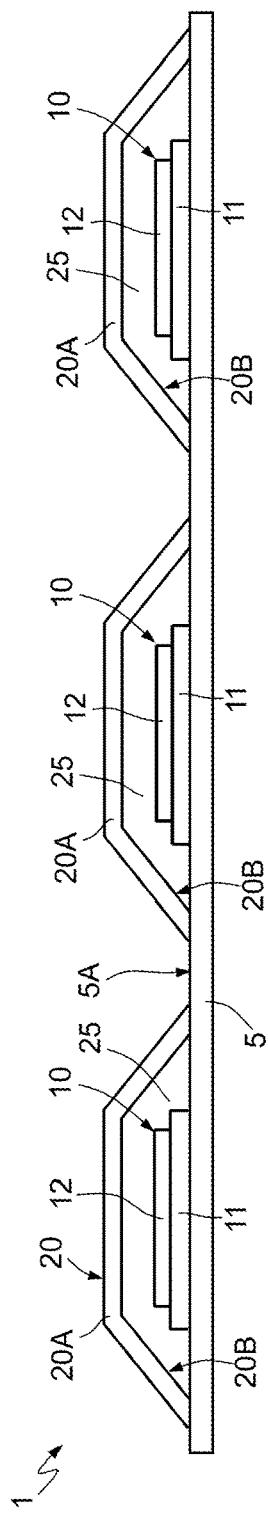
Figure 4:
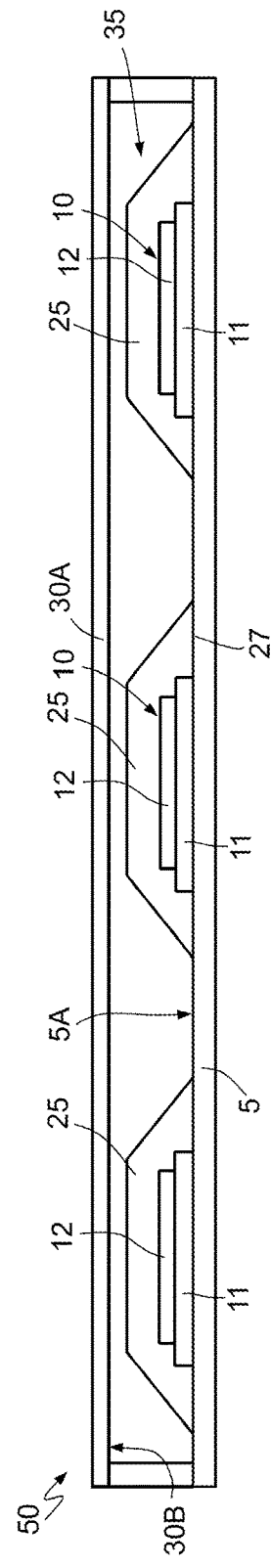
Figure 5:
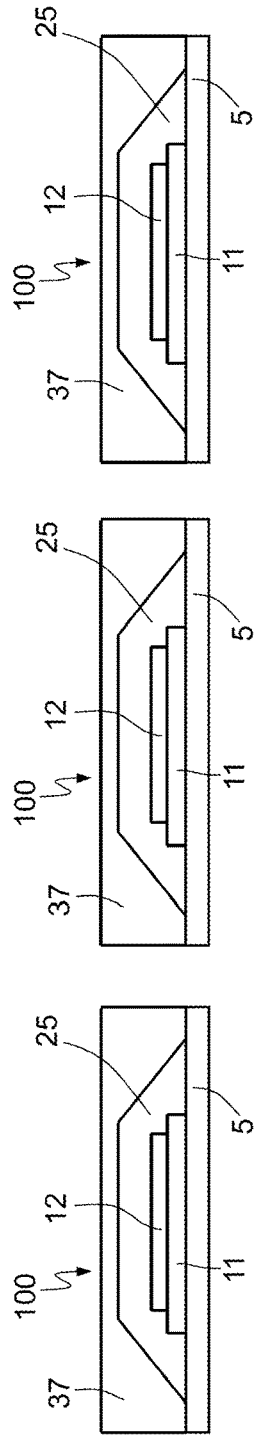

FIGS. 2-5 show successive fabrication steps of a plurality of packaged and singulated MEMS devices (three whereof are illustrated in FIG. 5). In particular, the present fabrication process is obtained by using the system 200 of FIG. 1.

Figure 2:
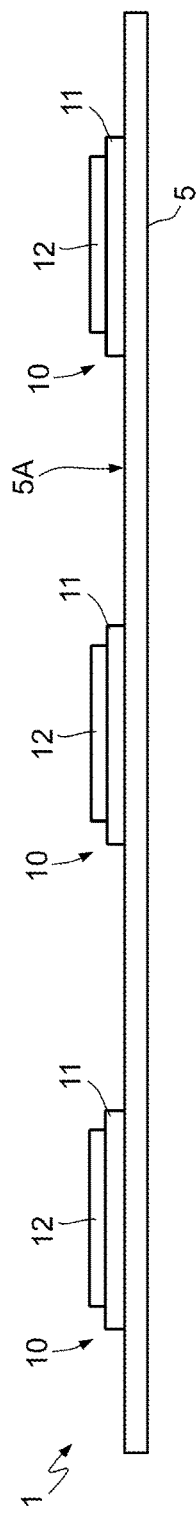
FIGS. 2 to 5 show, in cross-section, successive steps of the present fabrication process a MEMS device.

FIG. 2 illustrates a processing wafer 1 comprising a substrate 5 (for example, a laminated substrate or a semiconductor substrate, such as a silicon substrate), having a surface 5A. In particular, the substrate 5 is adapted for a package of an LGA (Land-Grid Array) type.

The substrate 5 carries, on the surface 5A, a plurality of MEMS structures 10, such as three MEMS dice are illustrated in FIG. 2. In detail, each MEMS structure 10 is electrically connected to the substrate 5 through a plurality of conductive tracks (not illustrated).

Each MEMS structure 10 comprises an ASIC (Application-Specific Integrated Circuit) 11, extending over the substrate 5, and a MEMS sensor 12, extending over the ASIC 11. In particular, the ASIC 11 is made per se known manner and is electrically and directly connected to the conductive paths of the substrate 5 and/or to the MEMS structure 10, in a per se known manner. The MEMS sensor 12 is a movement sensor, for example an inertial sensor, such as an accelerometer or a gyroscope, obtained in a per se known manner. The ASIC 11 and the MEMS sensor are made of semiconductor material, such as silicon, using standard semiconductor processing techniques.

With reference to FIG. 2, the processing wafer 1 is subjected to a first injection molding step. To this end, the processing wafer 1 is arranged in the molding chamber 206 of the system 200 of FIG. 1.

As illustrated in FIG. 3, a first molding matrix 20 is fixed on the surface 5A of the substrate 5. In particular, the first molding matrix 20 comprises first molding structures 20A (three whereof are illustrated in FIG. 3) that form respective first molding cavities 20B. The first molding cavities 20B have, for example, a frustopyramidal shape. Other shapes are, however, possible. Each molding cavity 20B is delimited by a respective molding structure 20A and by the surface 5A of the substrate 5 and it is arranged at a respective MEMS structure 10 so that each MEMS structure 10 is accommodated in a respective first molding cavity 20B, between the respective molding structure 20A and the surface 5A of the substrate 5.

A first coating material, of a polymeric type, such as resin (for example, EME-G770HE manufactured by Sumitomo), supplied in solid form (for example, pellets) by the hopper 202 to the injector 204 of the system 200, is brought to an injection temperature $T_i$ in a range, for example, between 170° C. and 180° C. (for example, 175° C.) by the heater of the injector 204, to form a first molten polymeric agglomerate.

The first molten polymeric agglomerate is injected into the molding chamber 206 by the injection system of the injector 204, at a transfer pressure $p_{tr}$ in a range, for example, between 7 MPa and 12 MPa (e.g., 8 MPa). Injection of the first molten polymeric agglomerate leads to the filling of the first molding cavities 20B of the first molding matrix 20, and enables complete coating of the plurality of MEMS structures 10 and of the surface portions 5A of the substrate 5 delimited by the first molding matrix 20, thus forming first coating regions 25.

A first curing step is carried out, wherein the first coating regions 25 are brought to a first curing temperature $T_{c1}$, for example in a range between 170° C. and 180° C. (in particular, 175° C.) in a first curing time tai of a duration a range, for example, between 70 s and 120 s (in particular, 90 s). The first curing step enables cross-linking of the polymeric bonds of the first coating regions 25, enabling a transition phase from the molten state to the solid state.

At the end of the first curing step, the processing wafer 1 is extracted from the molding chamber 206. Next, it is possible to carry out a first post-molding curing step, for strengthening the structure of the first coating regions 25. In particular, the first coating regions 25 are heated in dedicated ovens, external to the chamber 206, at a treatment temperature $T_{pc}$ in the range, for example, between 170° C. and 180° C. (e.g., 175° C.) for a treatment time $t_{pc}$ longer than the first curing time $t_{c1}$, having a duration in the range, for example, between 2 hrs and 8 hrs (in particular, 6 hrs). In this way, the polymeric bonds of the first coating regions 25 are further cross-linked, and hence strengthened.

Alternatively, the first post-molding curing step is carried out in the molding chamber 206.

At the end of the above steps, the processing wafer 1 has a plurality of first coating regions 25 that coat respective MEMS structures 10.

By virtue of the use of a polymeric material, in particular the above resin manufactured by Sumitomo, each first coating region 25 is compatible with the materials of the substrate 5, of the ASIC 11, and of the MEMS sensor 12, so as to limit the residual stresses caused by interfacing different materials. Moreover, in the present case, each first coating region 25 has a Young's modulus in the range, for example, between 20 GPa and 30 GPa in standard conditions of temperature and pressure (i.e., at 25° C. and 1 atm).

With reference to FIG. 4, the processing wafer 1 is subjected to a second injection molding.

In particular, after removing the first molding matrix 20, a second molding matrix 30 is arranged on the surface 5A of the substrate 5 of the processing wafer 1. The second molding matrix 30 comprises a second molding structure 30A, which covers the entire surface 5A of the substrate 5, and forms a second molding cavity 30B having, for example, a cylindrical shape. The second molding cavity 30B is delimited by the further molding structure 30A and by the surface 5A. Thus, the second molding cavity 30B accommodates the MEMS structures 10 and the respective first coating regions 25.

Next, a second coating made of polymeric material, such as rubber (for example, Sylgard 567 manufactured by Dow Corning), is supplied in liquid form (in particular, in case of Sylgard 567, a first and a second liquid component, mixed with each other) from the hopper 202 to the injector 204 of the system 200. In particular, the injector 204, through the heater, brings or exposes the second coating material up to the injection temperature $T_i$. In this way, the second coating material is molten (in particular, rendered plastic), to form a second molten polymeric agglomerate.

Next, the second molten polymeric agglomerate is injected by the injection system of the injector 204 into the molding chamber 206, in particular into the second molding cavity 30B, at the transfer pressure $p_{tr}$. Injection into the second molding cavity 30B of the second molten polymeric agglomerate fills the second molding cavity 30B and completely coats the surface 5A and the first coating regions 25 of the MEMS structures 10, to form a coating mass 35.

Next, the coating mass 35 is subjected to curing step. In particular, the coating mass 35 is cured for a second curing time ta, of a duration, for example, of 180 min, at a second curing temperature $T_{c2}$, for example equal to 70° C. Alternatively, the second curing time ta is approximately 120 min and the second curing temperature $T_{c2}$ is approximately 100° C. In both cases, the curing process here also enables cross-linking of the polymeric bonds of the coating mass 35.

At the end of the second curing step, it is possible to carry out a second post-molding curing step so that the polymeric bonds of the coating mass 35 are further cross-linked, and thus strengthened. The second post-molding curing step is similar to the first post-molding curing step previously described with reference to the first coating regions 25.

By virtue of the used material and to the described treatment processes, the coating mass 35 is compatible with the substrate 5 and the first coating regions 25 so that the residual stresses due to interfacing are limited. Moreover, the coating mass 35 has a Young's modulus lower than the Young's modulus of the first coating regions 25, for example between 100 MPa and 5 GPa, e.g., 500 MPa, in standard conditions of temperature and pressure (i.e., at 25° C. and 1 atm).

At the end of the first and second molding processes, a processed wafer 50 is obtained, which (FIG. 5) is diced, in a per se known manner, so as to obtain a plurality of MEMS devices 100, each having an own first coating region 25 and an own second coating region 37, deriving from dicing of the coating mass 35.

The MEMS devices 100 efficiently absorb the impacts and/or mechanical shocks to which they could be exposed during their operating life and protect the delicate internal structures (ASIC 11 and MEMS sensor 12). In particular, since each first coating region 25 has a high Young's modulus (i.e., a low flexibility), the first coating regions 25 mechanically protect and strengthen the internal structures, minimizing the thermo-mechanical stress between the materials of the first coating region 25 and the internal structures, as well as the substrate 5. Moreover, since the material of the second coating region 37 has a Young's modulus lower than the Young's modulus of the first coating region 25 (and hence more flexible), the second coating region 37 is able to efficiently absorb the impact caused by possible mechanical shocks.

Thus, the first and second coating regions 25, 37 are designed so as to decouple the mechanical stresses deriving from an external impact and deriving from interfacing between the different materials forming the MEMS device 100.

Figure 6:
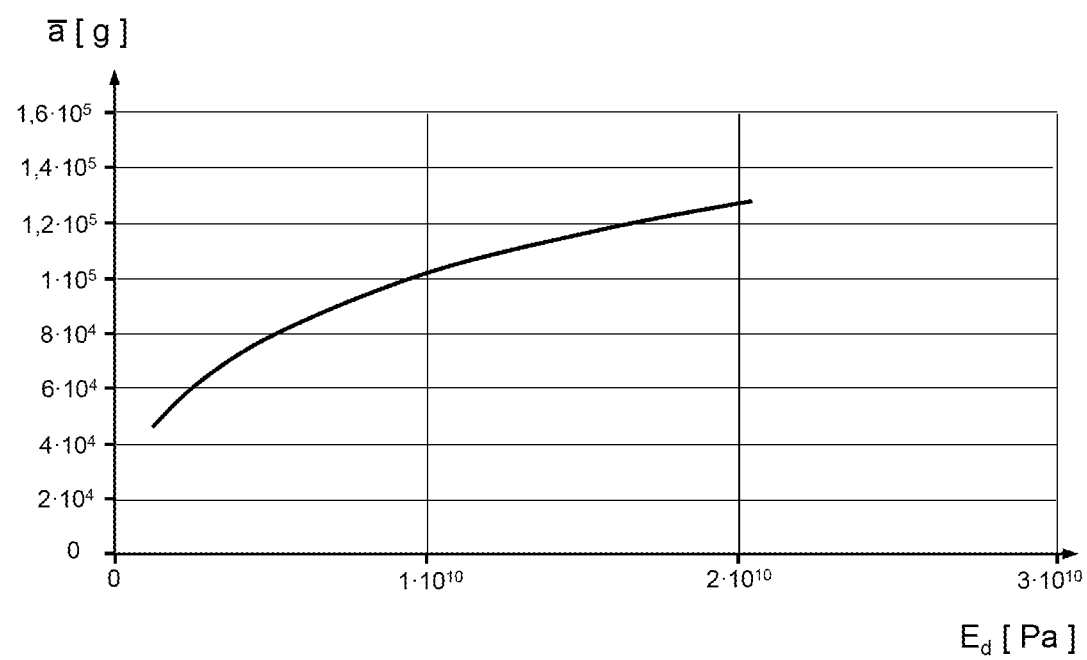
FIG. 6 shows the plot of a characteristic quantity of a coating region of the package of the present MEMS device.

In this connection, the Applicant determined the plot of the acceleration a as a function of the Young's modulus of the second coating region 37 of one of the MEMS devices 100 obtained according to the fabrication process described previously. This plot is shown in FIG. 6 and denoted by the reference A. In particular, the plot A was obtained analytically from Eq. (1), the abscissae representing the Young's modulus of the material of the second coating region 37 (term Ed of Eq. (1)) and the ordinates representing acceleration a.

The Applicant noted that, by decreasing the Young's modulus of the second coating region 37, the acceleration a significantly decreases. Consequently, the acceleration a perceived by each tested MEMS device 100 is lower than the impact acceleration a perceived by a MEMS device without the second coating region 37; moreover, the height of fall where the acceleration a is equal to 100,000·g increases. Consequently, the second coating region 37 imparts the MEMS devices 100 a greater robustness.

The Applicant then conducted further reliability tests and tests on the occurred adhesion of the second coating region 37, including a test of mechanical stress as reliability test and a peeling test as an adhesion test of the second coating layer 37. In the mechanical-stress test, a test wafer and a reference wafer were used.

Initially, the test and reference wafers were optically analyzed using known instruments (such as instruments of optical analysis, infrared analysis, X-ray analysis, tomography or SEM analysis), so as to verify the structural homogeneity thereof.

Next, the test wafer was indented with a needle probe having a tip with a diameter equal to, for example, 0.6 mm, for a testing time tt equal to, for example, 96 hrs, to detect the penetration rate, as well as the penetration limit, of the needle probe in the second coating region 37 of the test wafer.

In the executed indentation tests, the Applicant noted that the needle probe penetrates at a rate of 0.1 mm/s and reaches a penetration limit equal to 50% of the thickness of the second coating region 37; moreover, these results were obtained in any point of the second coating region 37.

Next, the test wafer was again analyzed and compared at an optical level with the reference wafer so as to verify the presence or absence of evident indentations in the second coating region 37 of the test wafer. The Applicant noted that there were no clear differences between the reference wafer and the test wafer after indenting the test wafer. Consequently, the second coating region 37 is able to efficiently respond to an external mechanical stress, minimizing the negative effects thereof; moreover, this characteristic is substantially present on the entire surface of the aforementioned second coating region 37.

In the peeling test, here of a chemical type, in the beginning the MEMS device 100 under analysis was treated with chemical solutions of a known type, such as nitric acid.

Next, the Applicant attempted to detach the second coating region 37 from the surface 5A of the substrate 5 and from the first coating region 25 and noted that the second coating region 37 detached in an uneven way, tearing. This result implies that the second coating region 37, obtained according to the fabrication process described previously, has a good adherence both to the surface 5A and to the first coating region 25.

The present MEMS manufacturing device and the corresponding process have various advantages.

In particular, the presence of two coatings with different Young's moduli enables the reduction of the negative effects of impacts and/or mechanical shocks, so that the MEMS device is sturdy, albeit in the absence of stoppers that are subject to deterioration. In fact, as mentioned above, the first coating region 25 (less flexible) minimizes the thermomechanical stress between the materials of the substrate 5 and of the second coating region 37, and the second coating layer (more flexible) is able to absorb the impact waves (and hence, the impact acceleration) generated by this impact. In other words, the thermomechanical stress between the materials and the stress deriving from an impact are decoupled by virtue of the greater flexibility of the second coating region 37 with respect to the first coating region 25.

In addition, the coating regions 25, 37 do not modify the electrical or detection characteristics of the MEMS device 100, which thus has a practically unvaried performance.

Furthermore, the present fabrication process enables formation of coating regions with a good degree of adhesion, and thus the characteristics of the MEMS device 100 are not degraded over time.

Moreover, the present fabrication process is simple to implement.

Finally, it is clear that modifications and variations may be made to the MEMS device and to the corresponding fabrication process described and illustrated herein, without thereby departing from the scope of the present disclosure.

For instance, the MEMS sensor 12 of the MEMS device 100 may be of any type.

Moreover, each MEMS structure 10 may comprise more than one MEMS movement sensor 12.

In addition, the materials forming the first and second coating regions 25, 37 may be different from the ones used in the fabrication process described previously; in particular, the choice of the materials may depend, for example, upon the application field and the geometry of the MEMS device.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
   manufacturing a plurality of micro electro-mechanical system (MEMS) devices by:
   placing a substrate into a molding chamber, the substrate including a plurality of MEMS structures, each of the plurality of MEMS structures including an application specific integrated circuit (ASIC) and a MEMS sensor, the MEMS sensor coupled to the ASIC, and the ASIC coupled to a surface of the substrate, the plurality of MEMS structures are spaced from each other;
   after placing the substrate into the molding chamber, placing a plurality of first molds on the surface of the substrate spaced from each other, each of the plurality of first molds covering each of the plurality of MEMS structures and first portions of the surface of the substrate, leaving exposed portions of the surface of the substrate uncovered by the plurality of first molds, the exposed portions between angled sidewalls of adjacent ones of the plurality of first molds, a plurality of first cavities between the substrate and each of the plurality of first molds;
   after placing the plurality of first molds, injecting a first coating material in the plurality of first cavities covering the plurality of the MEMS structures;
   after injecting the first coating material, curing the first coating material and forming a plurality of first coating regions having a first Young's modulus, the first coating regions being on the first portions of the surface of the substrate and covering the plurality of MEMS structures;
   after curing the first coating material, removing the plurality of first molds;
   after removing the plurality of first molds, placing a second mold on the substrate, the second mold covering the plurality of first coating regions, the plurality of MEMS structures, and the surface of the substrate, a second cavity between the substrate and the second mold;
   after placing the second mold, injecting a second coating material in the second cavity and covering the plurality of first coating regions and the surface of the substrate, the second coating material being rubber;
   after injecting the second coating material, curing the second coating material and forming a second coating region having a second Young's modulus, the second coating region has portions in direct contact with the substrate and covers the first coating regions, and wherein the first Young's modulus is higher than the second Young's modulus;
   after curing the second coating material, removing the second mold; and
   dicing through the substrate and the second coating region portions in direct contact with the substrate to form the plurality of MEMS devices.

2. The process according to claim 1, wherein the first Young's modulus is between 20 GPa and 30 Gpa, and the second Young's modulus is between 100 Mpa and 5 Gpa.

3. The process according to claim 1, wherein the plurality of first coating regions include a polymeric resin, wherein curing the first coating material enables cross-linking of the polymeric bonds of the first coating material.

4. The process according to claim 1, wherein the first coating region has a frustopyramidal shape.

5. The process according to claim 1, wherein the plurality of MEMS structures include the MEMS sensor electrically coupled to the ASIC, wherein the first coating material is a polymeric resin.

6. A process comprising the following steps in this order:
   coupling a MEMS structure to a surface of a substrate, the MEMS structure coupled to an application specific integrated circuit (ASIC) coupled to a MEMS sensor;
   forming a first coating region on first portions of the surface of the substrate and over the MEMS structure, the first portions of the substrate adjacent to the MEMS structure, the first coating region having a first Young's modulus, wherein forming the first coating region comprises:

placing the substrate into a molding chamber;
arranging a first molding matrix having angled sidewalls on the first portions of the surface of the substrate spaced from the MEMS structure, the first molding matrix covering the MEMS structure, a first molding cavity between the MEMS structure and the first molding matrix;
injecting a first coating material into the first molding cavity; curing the first coating material by exposing the first coating material to a first curing temperature for a first time period and forming the first coating region; and
removing the first molding matrix; and
forming a second coating region over the first coating region, the second coating region having a second Young's modulus, wherein forming the second coating region comprises:
arranging a second molding matrix on second portions of the surface of the substrate spaced from the first coating region, the second molding matrix covering the first coating region, a second molding cavity between the first coating region and the surface of the substrate;
injecting a second coating material into the second molding cavity;
curing the second coating material by exposing the second curing material to a second curing temperature for a second time period; and
removing the second molding matrix;
wherein the first Young's modulus is higher than the second Young's modulus.

7. The process according to claim 6, wherein the first Young's modulus is between 20 Gpa and 30 Gpa, and the second Young's modulus is between 100 Mpa and 5 Gpa.

8. The process according to claim 6, wherein the first coating region comprises a polymeric resin.

9. The process according to claim 7, wherein the second coating region comprises a polymeric rubber.

10. The process according to claim 6, wherein the second coating region remains uncovered.

11. The process according to claim 6, wherein injecting the first coating material comprises:
via an injector having a heater and an injection system, exposing the first coating material to a first injection temperature; and
injecting, via the injector, the first coating material at the first injection temperature into the first molding cavity at a first transfer pressure, the injector being supplied by a hopper.

12. The process according to claim 11, wherein injecting the second coating material comprises:
via the injector, exposing the second coating material to a second injection temperature; and
injecting via the injector the second coating material at the second injection temperature into the second molding cavity at a second transfer pressure.

13. A method, comprising steps of:
forming a plurality of MEMS devices by:
arranging a plurality of MEMS structures on a first surface of a substrate, the substrate having a plurality of conductive tracks, the plurality of MEMS structures each including an application specific integrated circuit (ASIC) coupled to ones of the plurality of conductive tracks of the substrate and a MEMS sensor coupled to the ASIC;
next, placing the substrate into a molding chamber;
next, covering the plurality of MEMS structures with a plurality of resin coating regions, respectively, using a plurality of first molds, the plurality of resin coating regions having a first Young's modulus, the plurality of first molds being spaced from each other by exposed portions of the substrate;
next, completely covering the plurality of resin coating regions with a rubber coating mass using a second mold and forming a packaged wafer, wherein the rubber coating mass has a second Young's modulus lower than the first Young's modulus; and
dicing the packaged wafer through the substrate and the rubber coating mass in direct contact with the substrate, each MEMS devices of the plurality of MEMS devices has a respective resin coating region of the plurality of resin coating regions covered completely by the rubber coating mass.

14. The method according to claim 13, wherein the first Young's modulus is between 20 GPa and 30 GPa, and the second Young's modulus is between 100 MPa and 5 GPa.

15. The method according to claim 13, wherein each MEMS device of the plurality of MEMS devices includes a respective MEMS structure, a respective resin coating region, and a respective rubber coating region derived from dicing the packaged wafer including dicing through the rubber coating mass.

16. The method according to claim 13, wherein covering the plurality of MEMS structures is carried out by an injector in a molding chamber, and the injector is supplied by a hopper.

17. The method according to claim 16, wherein covering the plurality of resin coating regions is carried out by the injector in the molding chamber.

18. The method according to claim 13, wherein the plurality of first molds have a frustopyramidal shape.

19. The method according to claim 13, wherein the plurality of first molds have angled sidewalls, the exposed portions of the substrate being between the angled sidewalls of adjacent first molds.

20. The method according to claim 16, wherein the injector injects resin coating between the substrate and the plurality of the first molds.

* * * * *